US008754338B2

(12) United States Patent
Dutta

(10) Patent No.: US 8,754,338 B2
(45) Date of Patent: Jun. 17, 2014

(54) ON-CHIP INTERCONNECTS WITH REDUCED CAPACITANCE AND METHOD OF AFBRICATION

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 424 days.

(21) Appl. No.: 13/118,412

(22) Filed: May 28, 2011

(65) Prior Publication Data

US 2012/0298411 A1 Nov. 29, 2012

(51) Int. Cl.
*H05K 1/11* (2006.01)

(52) U.S. Cl.
USPC ........... 174/264; 174/252; 257/432; 257/467; 257/618; 257/619; 257/774; 438/637; 438/694; 216/33; 349/114

(58) Field of Classification Search
USPC .......... 174/264, 252; 257/432, 467, 618, 619, 257/774; 438/637, 694; 216/33; 349/114
See application file for complete search history.

(56) References Cited

U.S. PATENT DOCUMENTS

| 5,753,132 | A * | 5/1998 | Shamouilian et al. ......... 216/33 |
| 6,107,143 | A * | 8/2000 | Park et al. .................... 438/296 |
| 7,056,822 | B1 * | 6/2006 | Zhao ............................ 438/619 |
| 2002/0155689 | A1 * | 10/2002 | Ahn et al. ..................... 438/592 |
| 2002/0157813 | A1 * | 10/2002 | Cho et al. ................. 165/104.26 |
| 2004/0013393 | A1 * | 1/2004 | Komura et al. ............... 385/137 |
| 2004/0053501 | A1 * | 3/2004 | Brennan et al. .............. 438/694 |
| 2004/0108862 | A1 * | 6/2004 | Azuma et al. ................ 324/691 |
| 2004/0109627 | A1 * | 6/2004 | Kim et al. ..................... 385/14 |
| 2005/0142759 | A1 * | 6/2005 | Lee .............................. 438/258 |
| 2005/0221524 | A1 * | 10/2005 | Hirai ............................. 438/30 |
| 2006/0071578 | A1 * | 4/2006 | Drabe et al. .................. 310/309 |
| 2006/0128137 | A1 * | 6/2006 | Furukawa et al. ............ 438/618 |
| 2007/0012431 | A1 * | 1/2007 | Miyahara ...................... 165/170 |
| 2007/0076146 | A1 * | 4/2007 | Harada et al. ................. 349/114 |
| 2008/0191303 | A1 * | 8/2008 | Carlson et al. ................ 257/467 |
| 2008/0210002 | A1 * | 9/2008 | Kamiunten et al. ....... 73/204.23 |
| 2008/0265352 | A1 * | 10/2008 | Akiyoshi ...................... 257/432 |
| 2010/0022084 | A1 * | 1/2010 | Chen et al. ................... 438/637 |
| 2010/0032810 | A1 * | 2/2010 | Ding et al. .................... 257/621 |
| 2010/0053269 | A1 * | 3/2010 | Fujii et al. ....................... 347/45 |
| 2011/0006204 | A1 * | 1/2011 | Bower et al. .................. 250/298 |
| 2012/0018898 | A1 * | 1/2012 | Ebefors et al. ................ 257/774 |
| 2012/0163749 | A1 * | 6/2012 | Huang et al. ..................... 385/3 |
| 2012/0305292 | A1 * | 12/2012 | Hori et al. ..................... 174/252 |

* cited by examiner

*Primary Examiner* — Xiaoliang Chen

(57) ABSTRACT

An electronics interconnection system is provided with reduced capacitance between a signal line and the surrounding dielectric material. By using a non-homogenous dielectric, the effective dielectric constant of the material is reduced. This reduction results in less power loss from the signal line to the dielectric material, and therefore reduces the number of buffers needed on the signal line. This increases the speed of the signal, and reduces the power consumed by the interconnection system. The fabrication techniques provided are advantageous because they can be preformed using today's standard IC fabrication techniques.

15 Claims, 12 Drawing Sheets

500A

500B

ON-CHIP INTERCONNECTS WITH REDUCED CAPACITANCE AND METHOD OF AFBRICATION

FIELD OF INVENTION

This invention relates to on-chip interconnection system with reduced capacitance between electronic interconnects and surrounding dielectric material used in on-chip electronic interconnection system. This invention is also related to high speed electronic interconnects reducing power consumption, high speed optical interconnects, and method of interconnecting two or more electronic elements on an Integrated Circuit (IC) chip.

BACKGROUND OF THE INVENTION

Integrated circuit chips today have up to 774 million transistors and have a die size of 296 mm². With such complexity of designs, the number of transistors that need to be "placed and routed" (in industry terms) and the wires that connect the transistors are becoming increasingly complex and small. As wires get smaller, they have or are about to reach the limits of physics.

On-chip interconnects have been a rising area of concern to the IC chip industry as resistance and capacitance of interconnects have both increased, leading to timing issues and higher power consumption by the interconnects. Nearly half the power consumed by an average computer is spent on the interconnects! This is because as the transistors have gotten smaller, the wires connecting them have also gotten smaller, but without help, the tiny signals from each transistor are not strong enough to make it across even the tiniest wires, another structure, called a repeater or a buffer, is needed to strengthen the signals.

When playing with large components like connecting wires and light bulbs to batteries, the wire was thought to be an equipotential region throughout the wire and also the voltage and current change was instantaneous. Wires are considered ideal when the circuits are designed for functionality like converting mp3 data bits into music. In the implementation of such functions via actual IC circuits, however, the reality is that dimensions of current IC wires (interconnects) are so small that parasitic capacitance and resistance, properties of their geometry, material properties and the surrounding material, become so complex on the scale that they cannot be ignored and become significant design challenges.

When the cross sectional area of wires became small enough that their resistance increased immensely and yet their lengths did not scale as much, then the resistance and capacitance due to the wires could no longer be ignored. They were termed parasitic resistance and capacitance and contributed to the delay of the signal propagation along the wires.

Ultimately, as interconnects on VLSI chips are the material media where currents and charge are moving, in general it also follows electromagnetic laws. However, transmission line effects come into play when wavelengths of the signal are comparable to the dimensions or length of the wires. Then at those times it cannot be assumed that the voltage and current are the same along the length of the wire, but instead they propagate like a wave down the wire. These effects are particularly evident when switching times are increasingly fast and the inductance dominates the delay behavior, especially when resistance is low, like on global metal lines which are much wider. Then interconnects behavior follows the transmission line equations (or telegrapher's equations):

$$\frac{\partial V(x)}{\partial x} = -(R + j\omega L)I(x)$$

and $$\frac{\partial I(x)}{\partial x} = -(G + j\omega C)V(x)$$

and combined they make:

$$\frac{\partial^2 V(x)}{\partial x^2} = \Gamma^2 V(x)$$

or $$\frac{\partial^2 I(x)}{\partial x^2} = \Gamma^2 I(x)$$

with $$\Gamma = \sqrt{(R + j\omega L)(G + j\omega C)}$$

and the characteristic impedance is:

$$Z_0 = \sqrt{\frac{R + j\omega L}{G + j\omega C}}$$

Characteristic impedance is the ratio of the instantaneous voltage and current at a point on the wire. If there are discontinuities in the characteristic impedance on any point of the wire, then signal reflections could occur and cause signal integrity issues and power transfer issues.

Transmission lines are typically divided into two low-loss lines and lossy lines, where low-loss lines have negligible resistance and conductance (G) and in lossy lines resistance and conductance cannot be neglected. Most dielectric materials used in IC chip manufacturing are insulators, the conductance is very low since they are insulators, except for cases when water vapor is introduced into the dielectrics. And also when resistance is very high, inductance is comparatively low at that frequency, the circuits are then dominated by the RC effects and not the LC effects.

As the wires increase in width, the resistance goes down, and global wires typically have less resistance per unit length. Actual total resistance values for M1-M3 wires are scaled by their length, so for M3 wires which are much shorter, for lengths of around 1 gate pitch (now typically the same as the M1 pitch) the total resistance value is much less.

Resistivity is also influenced by geometry when electrons are also encountering the boundaries of the conductor in their mean free path due to the much smaller dimensions of the conductor. Resistance used to be calculated just by the bulk resistivity, which is 1.7μΩ-cm for copper.

Also another issue with resistance is with the use of copper interconnects, since the dual damascene process had to be implemented, barrier metals like cobalt, titanium, titanium nitride, tantalum, tantalum nitride are used to prevent copper ions from diffusing into the silicon dioxide or silicon and degrade the insulation of the dielectric. The barrier metals typically have good conductivity but are still higher than copper, like tantalum has a resistivity 10 times higher than copper and so increases the resistivity of the interconnect.

Also at higher frequencies, the resistance increases as the current does not tend to flow uniformly through the whole conductor, but instead flow on the surface which reduces the total surface area. This is expected to be an issue for larger wires, which at the frequencies used are much larger than the skin depth so the effective surface area is reduced. On the M1 and intermediate wires or minimum global pitch the skin depth is as wide as the wire, and so does not have an effect. The equation for skin depth is:

$$\delta = \sqrt{\frac{\rho}{\pi f \mu}},$$

Copper at 1 GHz has a skin depth of 2 μm.

Inductance (self-inductance) is also calculated from the geometry of the conductor and its distances to other inductors. Self-inductance is generally negligible because most materials used in IC chip manufacturing have a magnetic permeability of vacuum. Mutual inductance depends highly on the current return path. Mutual inductance describes the inductive coupling that will be seen degrading signals. The current return paths are not set and the current will return on the paths that have the lowest impedance (Z=R+jwL). In VLSI logic design, data paths are connected to the gate port of the CMOS and so are terminated by capacitors. Current can also return on adjacent wires, parallel power supply buses, or the substrate. Therefore typically at lower frequencies global signal lines which have much lower resistances will have the lowest impedance and will be the sources of the current return. At higher frequencies, however, the lower impedance return paths may be on smaller signal wires, which may be closer to each other. So therefore the area of the influence of the magnetic flux generated by that loop that couples to the other loops of wires may increase or decrease along with frequency.

Inductance, L, is also multiplied by the frequency in the impedance, jwL, so at higher frequencies the inductance increases. The wire can no longer be considered in the RC regime, but modeled as a transmission line if the time of flight, length divided by the propagation velocity, is longer than the rise time of the driving transistor, which is expressed as:

$$t_r < 2.5 \frac{L}{v_p}$$

Loss is generally not an issue for on-chip interconnects because the length of the majority of wires is too short. It is not the loss that limits the clock speed, rather than it is the RC delay that limits the clock speed.

The loss tangent is generally calculated with this equation:

$$\tan\delta = \frac{\omega\epsilon'' + \sigma}{\omega\epsilon'}$$

but ignoring the imaginary part of the dielectric constant, the loss tangent is calculated for transmission lines as:

$$\tan\delta = \frac{ESR}{|X_c|} = \omega C \cdot ESR = \frac{\sigma}{\epsilon' \omega}$$

Silicon dioxide is an insulator and has a very low conductivity of $10^{-9}$ to $10^{-16}$ S/cm (varies with what process the silicon dioxide is made and its impurities, for films on doped silicon, the conductivity is higher), which brings its loss tangent per GHz (using keff=4.2 for silicon dioxide and the highest conductivity $10^{-9}$) to be: $4.28 \times 10^{-11}$ which is still very much less than 1 and the dielectric is considered low loss.

For low loss tangents (<<1), $\tan\delta \approx \delta$ then power attenuation would be characterized by:

$$P = P_o e^{-\delta kz}$$

Meaning the length at which it attenuates to $e^{-1}$ level, is 1/δk, which for silicon dioxide is $4.85 \times 10^{11}$ m.

Compared with FR4, which has a conductivity that is largely frequency dependent so that at 1 GHz the conductivity is $10^{-4}$ S/cm, the loss tangent is much higher. FR4 has a transition frequency at 10 Hz at which the conductivity goes up much higher.

Porous silicon dioxide materials can be expected to be even further insulating because of the inclusion of air pockets and so would also have lower conductivities, and thus lower loss tangents.

Conductance is also a measure of the dielectric loss of a material and for the parallel plate or microstrip configuration of the conductors on the IC chip. Some attempts at measuring the permittivity of low-k materials have also tried to measure the conductance but it was found that the metal loss greatly exceeds the dielectric loss, even at frequencies of 40 GHz.

RC Delay calculated from the resistance and capacitance of the element is the measure of an element to discharge to 37% of its original charge. With interconnects, resistance and capacitance are modeled as lumped or distributed resistances and capacitances because the majority of the wire lengths inside of a chip are still much shorter than the signal wavelength and transmission line models are not needed. Therefore most of the wires on the IC chip are RC limited, and some wires may have some transmission line effects, particularly the global wires that are much longer.

RC delay in general prevents clocks and data from switching as fast and limits the clock speed. However since resistance and capacitance is dependent on the length of the wire, for shorter lengths, RC delay is very small. For longer wires like the global interconnects, RC delay becomes as much as the gate delay or many times more, further eating into timing budgets and limiting the clock speed. However, 1 mm wires, considered long wires, consist of less than 1% of the total interconnects distribution. But global interconnects have even higher aspect ratios (around 2.0 to 2.4) so cross talk still dominates on the capacitance. For a chip with number of gates Ng, equal to 1 million, this is roughly 4 million transistors for 2007 32 nm technology, roughly a 2.7 mm² sized chip, with lower functionality. The cumulative interconnect length distribution density shows that interconnects less than 10 μm compose 98% of the interconnects on a chip with 1 million gates.

However with higher RC delay, it means more current (charge) would be needed to charge and discharge (switch) the circuit. Chip designers could use larger transistors to provide more driving current but instead they add more repeaters which are basically inverters on the interconnect line. Adding repeaters adds a little bit of delay but adds current to the signal line because of the pull-up and pull-down structure of CMOS logic.

Repeaters are merely inverters placed in the timing path to manage clock skew due to varying lengths of the paths. Repeaters are not flip-flops that are clock gated, but merely adjust the skew on data path by a few picoseconds, so that data or clocks arrive at all of the load gates/flip-flops at the same time. By splitting up the wire segments into shorter lengths, the RC delay due to the interconnects is managed. However RC delay is not affected significantly by capacitance reduction, but resistance contributes to the majority of the RC delay and capacitance reduction due to using low-k materials mitigates the rising resistance.

The crux of the matter is that RC delay has not decreased at all with the lowering of capacitance because of the higher growth rate of resistance. Also with scaling of interconnect widths, the interconnect lengths have not scaled much because IC chip designers have just added more gates and more functions. Resistance is also not scaling linearly anymore due to added effects of surface scattering and line-edge roughness and copper barrier metal thicknesses, which all complicates the linear dependence of $R=\rho l/A$.

Therefore it is not possible to get rid of repeaters by using air-gap technology since resistance is the major contributor to the RC delay. However repeaters will not solve the issue of long-lines running into transmission line effects as although repeaters lessen delay, they are not clocked elements. Therefore IC chip designers have tried to design digital circuits that do not need to travel far distances like multi-core architectures.

Most effort in terms of repeaters has been put to maximize the decision algorithms on how many repeaters should be put in an interconnect line so that the power penalty due to the repeaters will not be significant.

Each buffer uses power to operate, and increases the total time the signal takes to move along the wire because the signal is "held up" a small amount of time at each buffer. There are a few different methods currently attempting to battle the problem of interconnect speed and power consumption, usually by reducing the number of buffers needed along a signal line. All of the current methods suffer from significant drawbacks.

One current method of reducing the number of buffers is to use a low-k dielectric material as the layer between the metal interconnects, instead of the standard $SiO_2$. As a signal moves along a wire, some of its power is lost to the surrounding dielectric material. A lower dielectric constant means that less power is lost to the surrounding material, meaning fewer buffers are needed to strengthen the signal. However, the low-K dielectric materials require using many types of barriers which increases fabrication costs, and low-k materials also tend to be more porous and poor heat conductors.

One method that had been explored to reduce signal line capacitance is differential signaling. With differential signaling, a signal is placed on one line and simultaneously duplicated but the opposite voltage on the other line. Then at the receiver end, the voltage is subtracted and the difference is read to give the signal again. This makes differential signaling less sensitive to noise than single-ended lines. Though the noise margin is doubled and ground offsets, these do not matter because of the subtracting operation that happens at the receiver. Also with differential signaling lower signal swing is also needed because the receiver looks at the difference in voltages, which will need lower supply voltages to be used.

Also with differential signaling, since typically the two lines are balanced (meaning they have the same impedance to ground), it is less susceptible to electromagnetic interference, and inductive coupling. Differential lines have much more noise immunity because of the differencing at the receiver and since both lines are affected by about the same inductive coupling, then there is little difference between the two signals and the signal is transmitted cleanly.

Having two lines also has the advantage of supplying a nearby return path for every signal, so noise and signals are more isolated from each other and not coupled into nearby signals. Also it becomes more isolated from supply lines and the associated noise of supply lines.

Since the voltages are equal and opposite, the capacitance is constant, and is lower than parallel single-ended lines, where the Miller effect doubles cross-capacitance. Differential lines also have predictable and constant cross-capacitance in between the lines, compared to data-dependent cross-capacitance single-ended lines in CMOS. As a result of higher noise resistance and lower capacitance of differential lines, differential lines can typically have much faster speeds than single-ended lines. However, capacitance can also come from other differential lines or single-ended lines near the differential lines and can be data dependent.

However, for CMOS differential lines they will add an extra penalty of two times the number of nets that need to be routed, meaning that 2*N (where N is the number of lines) routing lines will now have to be routed in the same space. Also at each gate, the drivers will have to be modified to also provide the differential signal and receivers will also have to be placed to take the differences in the voltages to get the signal out again for the logic. To determine if all signal lines are replaced with differential lines or only some will also require much more design management. Clock jitter and clock skew could still significantly affect differential signal lines.

As with all differential signal schemes, there is always current flowing through one of the lines, so there is a higher static power consumption, compared to CMOS, which only dissipates power in a 1 to 0 transition. Static power consumption of differential signal lines will depend on what the load resistance is on the receiver and resistance of the wire. LVDS uses a common mode voltage of 1.2V which can be driven by CMOS circuits with VDD of 2.5V or lower. Static power consumption across the load resistor on LVDS is 1.2 mW and the low differential voltage, 350 mV, decreases the dynamic power consumption.

Differential signaling has been applied widely off-chip and quite a few standards exist for them. Most of them are high-voltage schemes with the exception of LVDS which uses low-voltage. However, off-chip they can travel quite far distances and at high speeds. Current standards include: LVDS, differential ECL, PECL, LVPECL, RS-422, RS-485, Ethernet physical layers, PCI Express, USB, serial ATA, TMDS, FireWire and HDMI.

Currently on-chip there has been no use of differential signaling, although there have been several designs and several patents. It seems there are many ways to design CMOS circuits to provide differential signals, like the one disclosed in U.S. Pat. No. 6,294,933 which is a fairly simple circuit for the driver, with feed forward capacitors, a receiver, and uses VDD as the reference voltage instead of requiring an outside reference voltage. Using the sizing of transistors, it is possible to make a source drain resistance that will make the signal swing around VDD/2, and with a signal swing of less than ¼ VDD.

It seems differential signaling would be most useful on clock nets which are most active and have highest frequency. Most of the power is saved from the reduction of the signal swing to less than half of the supply voltage. A differential circuit has some static power consumption due to some current always being on the line flowing through the open transistor, even if no signal is being transmitted, the logic state of one line is zero and the other is one. But, at higher frequencies, the total power consumption is less than total power consumption of single ended lines at higher frequencies because of the massive reduction in the signal swing voltage (to 25% of the original VDD).

There has been much interest in developing side-air gaps and several papers have been published and it has been mentioned as a possible technology for the future roadmap by ITRS. However, side air-gap technology also poses some integration issues with via mis-alignment leading to chip failure, and also the use of extra masks to limit the air-gaps and integration of new materials like polymers as sacrificial materials as they will modify the copper dual-damascene process. Furthermore, incorporating side-air gaps reduce the power reduction significantly at all.

Another method that is being explored to increase interconnect speed is using optical signals in part, instead of metal transmission lines only. Optical signals are already used in the off-chip case, but on-chip placement faces significant challenges and drawbacks. Primarily, adding optics makes a chip far more complex, and increases difficulty of manufacture and manufacturing cost, and it also greatly increases the power needed for the interconnect system.

One example of an on-chip optical interconnect is disclosed in the U.S. Pat. No. 6,147,366 patent. For an optical interconnect, it is necessary to provide a transmitter and a receiver, preferably located on-chip. Silicon can not be used as an emitter, so the emitter must be formed of some other material, or in some cases the light is provided off chip. Then an optical interconnect requires wave guides, guiding the optical signal to its receiver, which further increases the complexity of the chip. Finally by adding the receiver, the overall complexity of the chip is very significantly increased over having a simple metal wire transmit the signal. Both the transmitter and receiver also require power to operate, which is a major drawback compared to a wire which requires little or no power to transmit a signal.

Therefore, it is highly desirable having metallic interconnect for on-chip which not only alleviates the issues involved in all of those solutions described above, but it also could provide significant advantages in respect to having lowering power requirement, required for the interconnects, and yet increasing the interconnect bandwidth (for the digital application) and significantly lowering the attenuation (true for both analog or digital applications) induced due to the interconnects.

BRIEF DESCRIPTION OF THE DRAWINGS

The invention will be explained in more detail in conjunction with the appended drawings wherein.

DETAILED DESCRIPTION

Figure 1A:
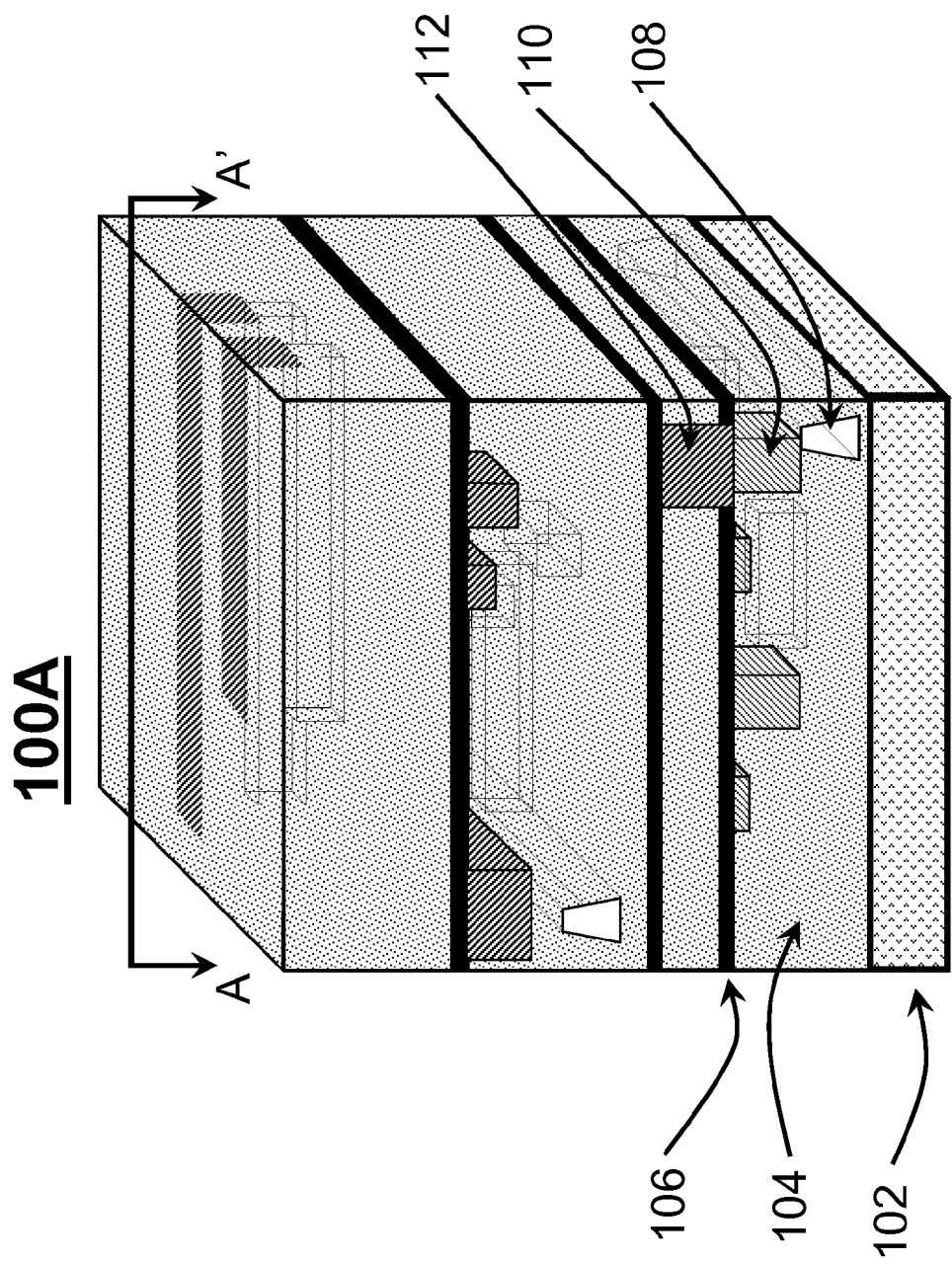
FIG. 1A is a 3D structural representation of a first embodiment of a semiconductor device constructed according to the principles of the invention, illustrating trenches embedded in the dielectric layers above and below the signal lines. For simplicity, only a few layers of the whole semiconductor device are shown.

The best modes for carrying out the present invention will be described in turn with reference to the accompanying drawings. In the following description, the same reference numerals denote components having substantially the same functions and arrangements, and duplicate explanation will be made only where necessary.

As an electrical signal inside a semiconductor device propagates along a wire, it loses power and eventually dies before reaching its destination. The loss is in part due to the close proximity of other wires, which interferes or causes "cross talk" between the wires, weakening each signal. The loss is also most of the part, due to the capacitance of the dielectric material upon which the signal wire rests. The general situation is that the dielectric material is $SiO_2$, which has a dielectric constant of about 3.5. By adding open air trenches to the dielectric material, the present invention can significantly reduce the dielectric constant. When the constant is lowered, there is less capacitance between the dielectric and the signal wire, and therefore less power loss. The reduction in power loss means that fewer buffers are needed along the signal wire to reinforce the signal strength. Ultimately, less buffers means the signal may propagate faster, and the interconnection system as a whole requires less power to operate because there are fewer buffers to power.

With current aspect ratios of wires' height being much taller than width, cross-capacitance dominates the capacitance calculations, contributing up to 70% of the total capacitance. Additionally the length of wires at lower levels is so short that RC delay does not become a design bottleneck at the M1-M3 levels. Instead the RC delay bottleneck comes from the minimum pitch global interconnects that might have a few data paths that span the length of the chip. Therefore it is the length of global interconnects that is still causing the RC delay bottleneck. Additionally, at the global interconnects level, because of the larger size of the wires and lack of routing space, wires are routed densely at minimum pitch, therefore making cross-capacitance the dominant capacitance contribution.

Adding air-gaps in between wires on the metal layer significantly reduces the cross-capacitance. Adding air-gaps not only on the sides but on the top and bottom reduces the capacitance the most. In addition, adding air-gaps on the top and bottom only also has influence on the side capacitance contribution and helps to reduce the cross-capacitance.

One possible embodiment is adding side air-gaps and top and bottom air-gaps in silicon dioxide, and not using low-k material. This can lower the effective dielectric constant less than with homogenous low-k dielectric materials which are not coming out until the year 2012 when the dielectric constant of low-k materials can catch up to the effective dielectric constant that can be made by air-gaps (as projected by ITRS). It is preferred to preclude the use of low-k materials, which is an attractive option though. However, using low-k materials requires using many types of barriers and low-k materials tend to be more porous and poor heat conductors.

In the preferred embodiments described below, the dielectric materials include a wide range of materials known to those skilled in the art, and sold under different trade names. For example, ceramic materials including high frequency laminate marketed under the Trademark name Duroid™, AlN, $Al_2O_3$, Mullite ($3Al_2O_3$: $2SiO_2$), $SiO_2$, Silicon nitride, Silicon carbide, Silicon-Oxy-Nitride, BeO, Cordierite (magnesium iron alumina silicate), BN, glass (with different compositions), epoxy glass, such as FR4, CaO, MnO, $ZrO_2$, PbO, alkali-halide (e.g. NaBr, NaCl) BN, BeO, etc., and different types of polyimide and benzocyclobutenes (BCBs) having desirable dielectric properties are equally applicable. Other polymeric dielectric materials also include, but are not limited to, polytetrafluoroehtylene (PTFE) marketed under the Trademark name TEFLON™, liquid crystal polymer, epoxy, parylene, silicone-polyimide, silicone-gel, fluorinated ethylene propylene copolymer. It also includes elastomers (e.g. silicone elastomer), monomers, and gels. Dielectric materials which can be made using high temperature ceramics processing or IC fabrication processing, also are included in this category. All standard polymers can be available from the standard manufacturers for example, DuPont, Hitachi-Chemical, Mitsui, and Mitsubishi-Chemical Industries. The liquid crystal polymer is marketed by Gore-Tex of Japan.

FIG. 1A depicts a first embodiment of the invention, formed according to a non-conformal process, where there are open trenches 108 in a dielectric material 104 which run parallel to and above or below signal wires 112. 110 are the vias connecting the various signal line layers. 102 is the device layer, composed of transistors (not shown) embedded on a silicon wafer. 104 is the dielectric material, for example it may be $SiO_2$ or some other low-k materials. 106 is a silicon nitride stop layer used for the Copper damascene process.

In another possible embodiment, the open trenches 108 could be filled with a liquid coolant, a porous material, or be used as waveguides to allow an optical signal to pass through. The liquid coolant would be advantageous because this would help dissipate the heat of the nearby signal lines of powered elements. A porous material could be advantageous because, while it may not lower the dielectric constant as much as an open trench, it will provide more structural support. Finally, allowing an optical signal to pass through the trench would be advantageous because it would allow for a superior usage of space, resulting in an ultimately smaller, more efficient chip.

This arrangement is advantageous because as a signal travels along a signal wire 112, a portion of the surrounding electromagnetic wave travels through the parallel trench 108 instead of through the dielectric material 104. Open air has a much lower dielectric constant than the dielectric material, so the effective dielectric constant of the combined system of trenches and dielectric material is much lower than it would be with the dielectric material alone. Because the effective dielectric constant of the surrounding material is so much lower, there is a much lower capacitance between the signal wires 112 and the surrounding materials. Lower capacitance means less power is lost from the signal, so it can travel further without being reinforced by a buffer.

It is important to note that this invention directly relates to the capacitance between the signal wire and the surrounding material. Even if there was only a single signal wire passing through a region of dielectric material, the addition of trenches above and below the signal wire would significantly decrease capacitance and decrease power loss.

Figure 1B:
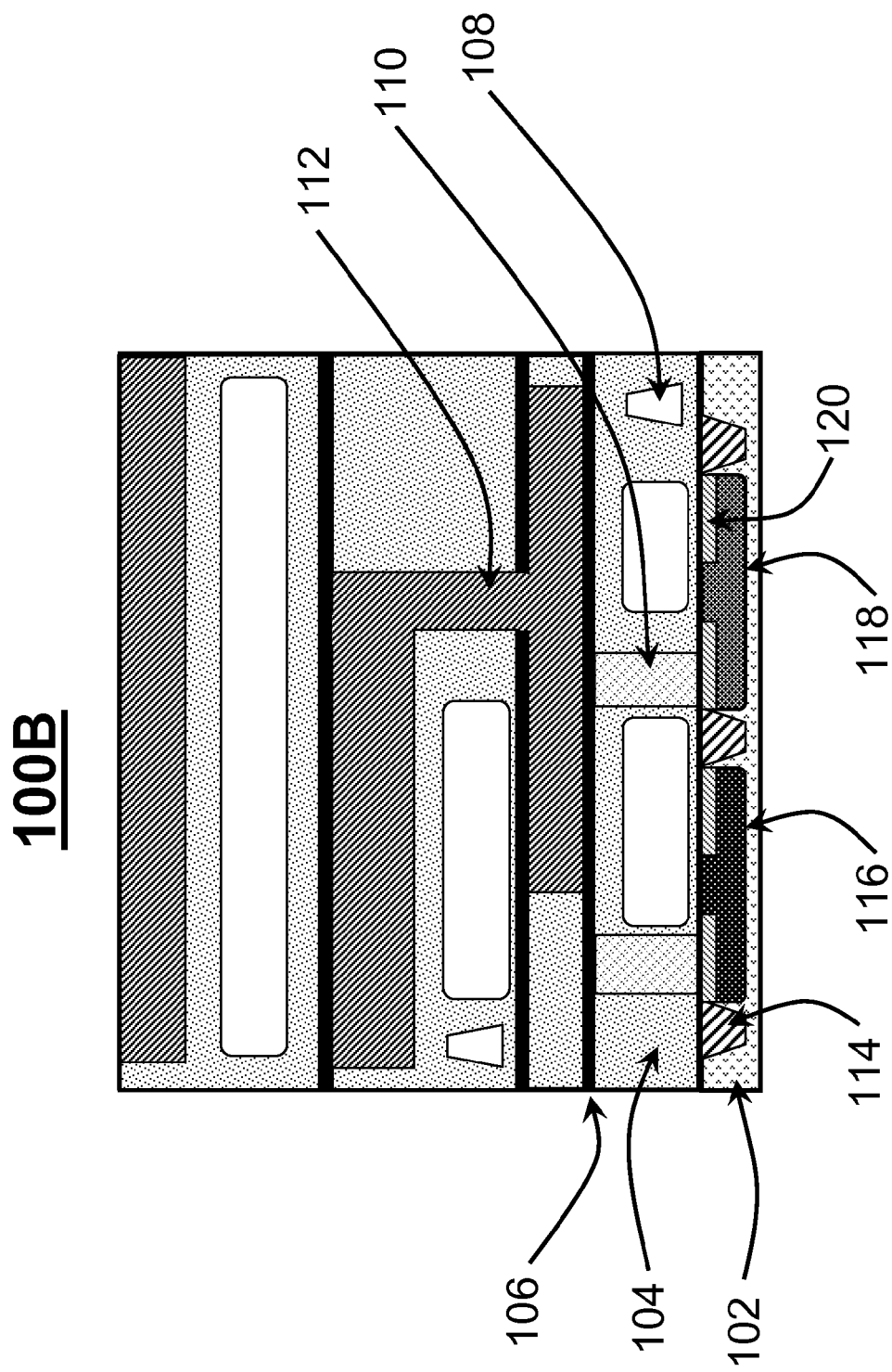
FIG. 1B is the cross sectional view along AA' showing a portion of a first embodiment of a semiconductor device constructed according to the principles of the invention.

FIG. 1B is a cross sectional view of FIG. 1A taken along the AA' plane. This diagram further illustrates that that open trenches 108 are embedded in the dielectric material 104. In addition, FIG. 1B shows two exemplary transistors, 116 and 118, (other transistors not shown) with electronic connections 120 and insulators 114 embedded between the transistors in the device layer 102.

Figure 2A:
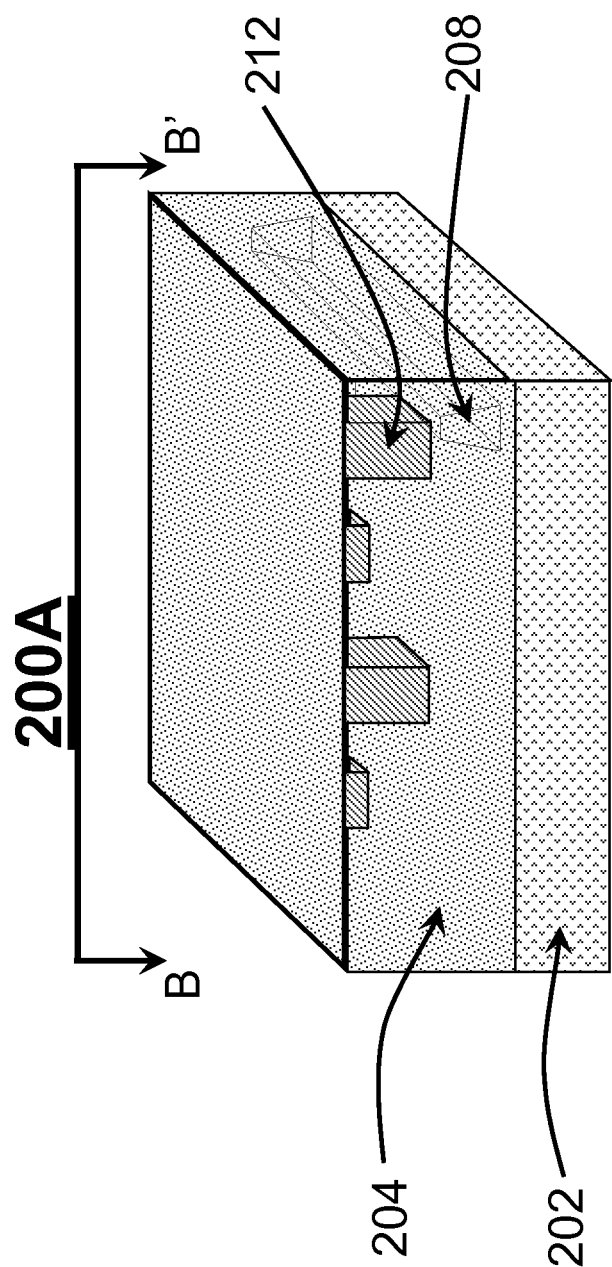
FIG. 2A is a 3D structural representation of a second embodiment of a semiconductor device constructed according to the principles of the invention. For simplicity, only a few layers of the whole semiconductor device are shown.
Figure 2B:
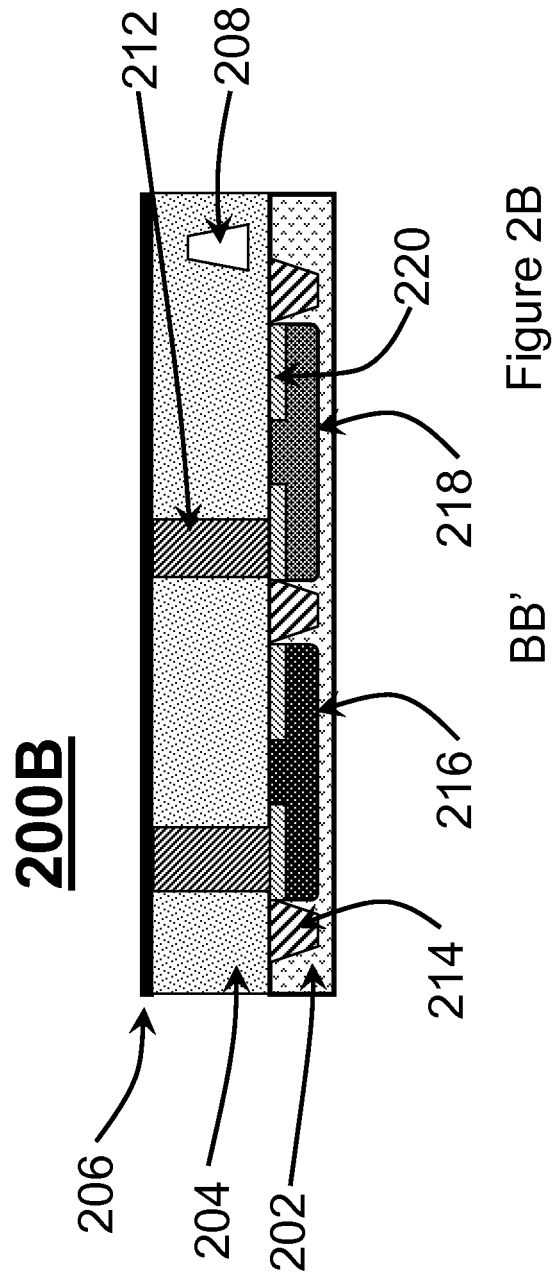
FIG. 2B is the cross sectional view along BB' showing a portion of a second embodiment of a semiconductor device constructed according to the principles of the invention.
Figures 3A, 3B, 3C, 3D:
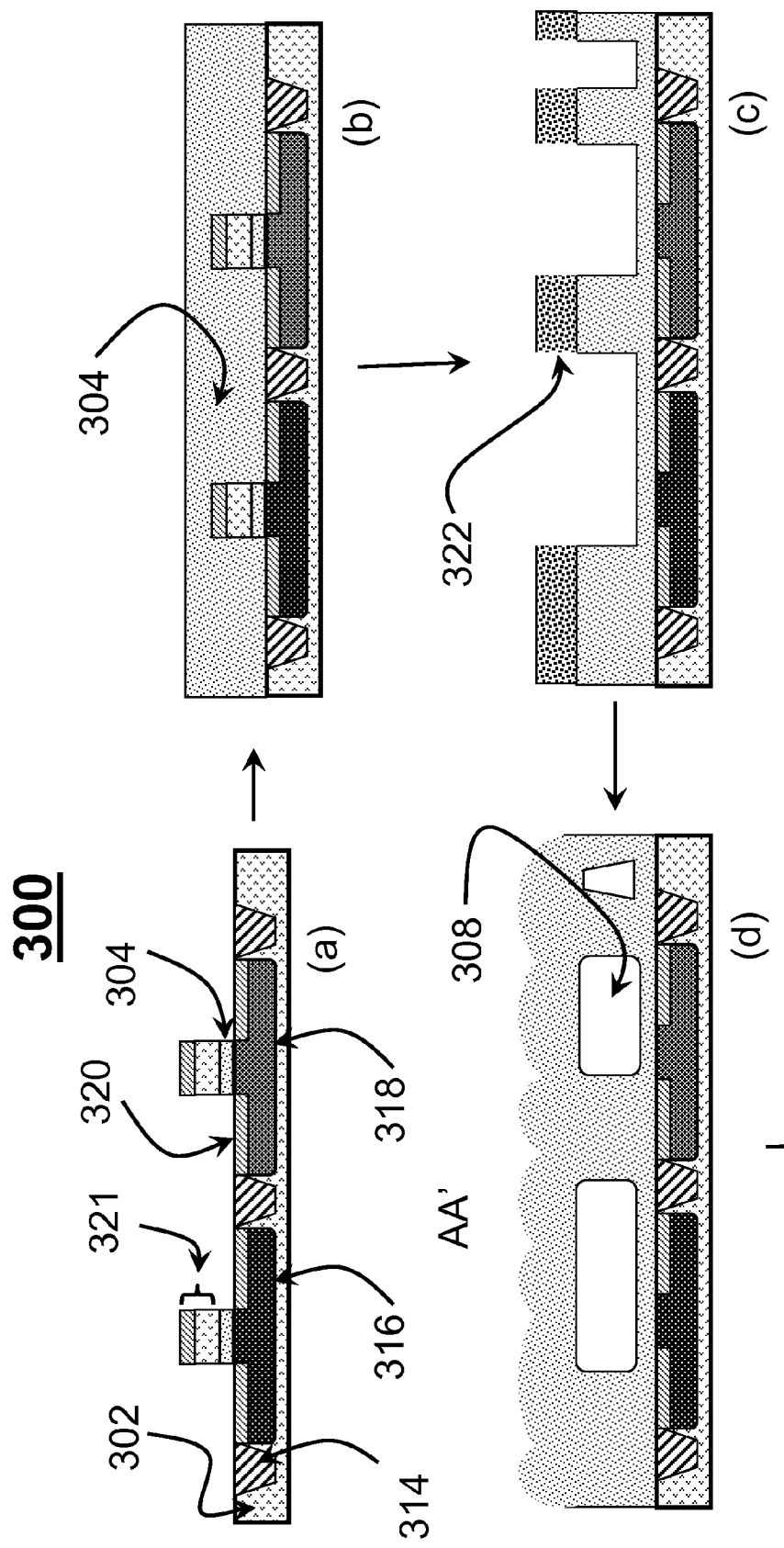
FIG. 3 is a structural depiction illustrating the non-conformal fabrication process of one embodiment of the present invention.
Figures 3E, 3F, 3G:
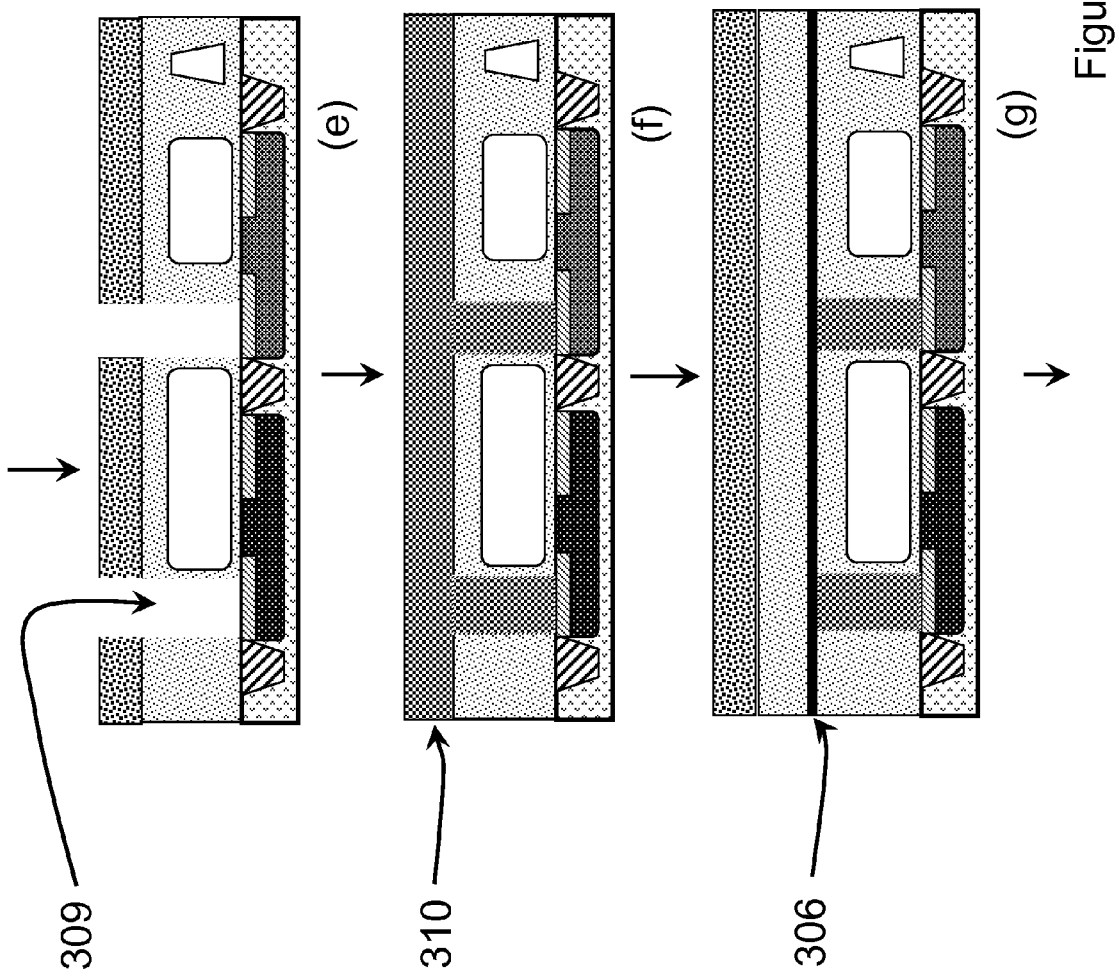
Figures 3H, 3I, 3J, 3K:
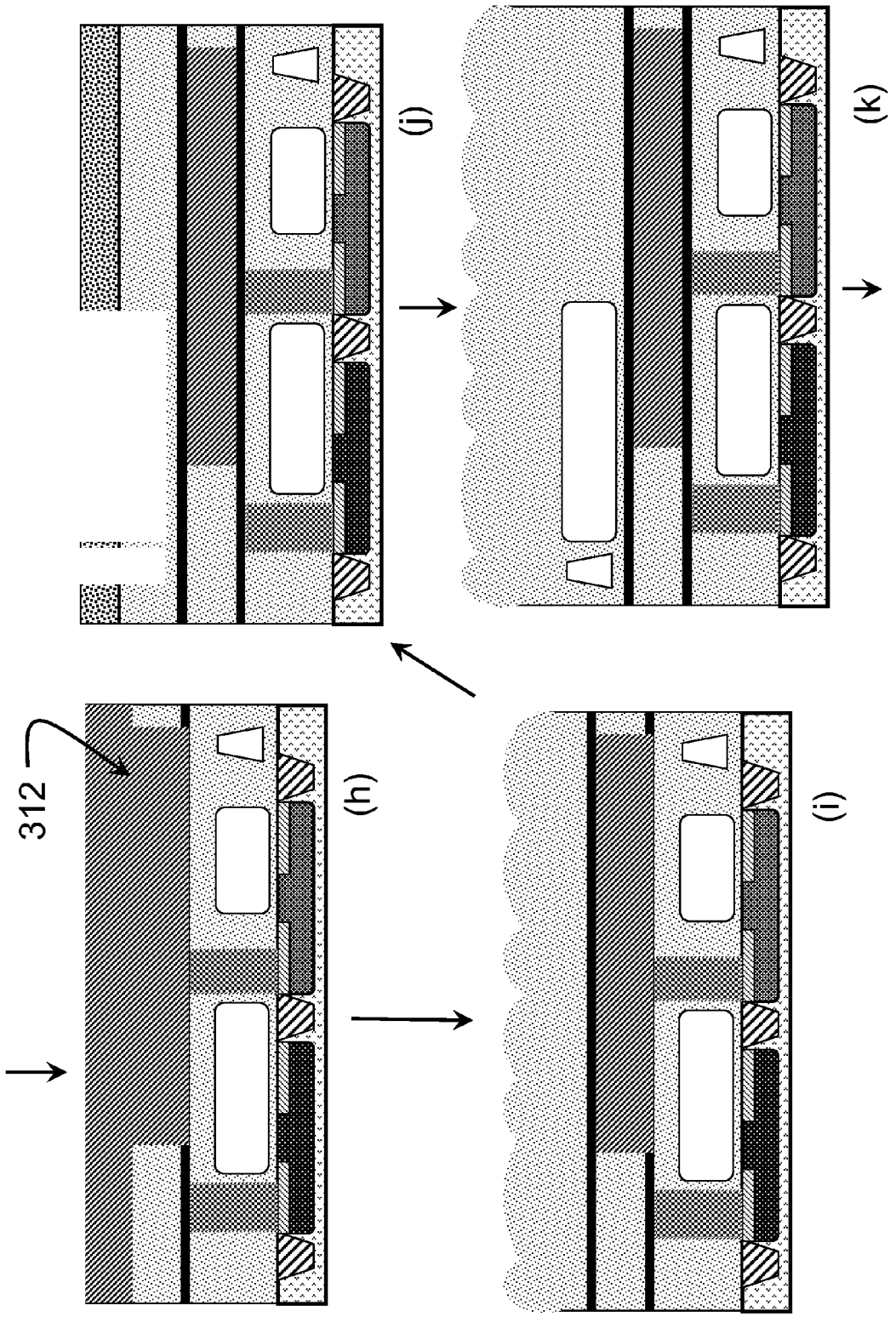
Figures 3L, 3M, 3N, 3O:
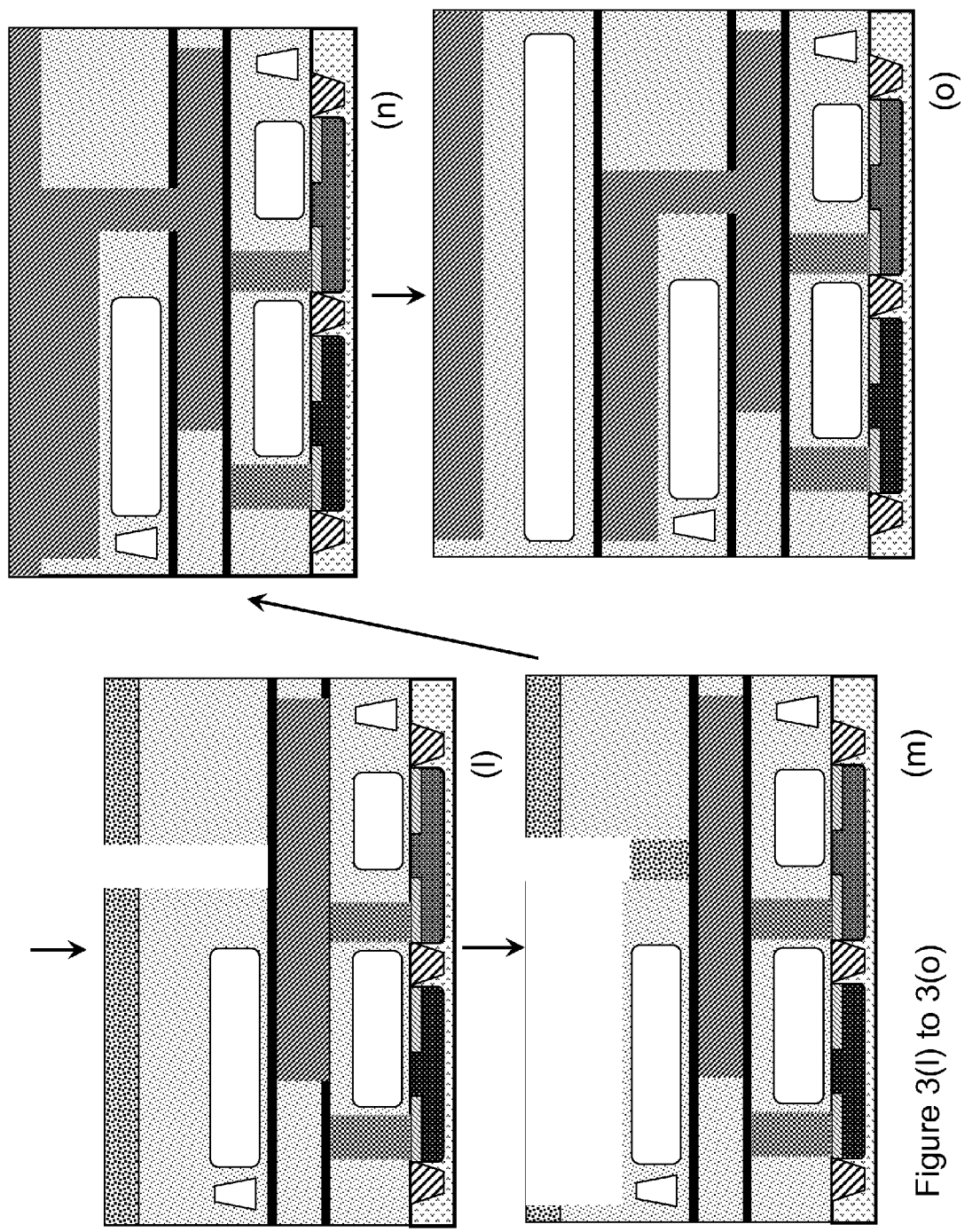

FIG. 2A depicts a second embodiment of the invention, formed according to the sacrificial process, where there are open air trenches 208 in the dielectric material 204 which run parallel to and above or below the signal wires (not shown). FIG. 2B is a cross sectional view of FIG. 2A taken along the BB' plane. 202 is the device layer, composed of transistors 216, 218, and others not shown, embedded on a silicon wafer, and separated by insulators 214. 220 are the electronic connections on each transistor. 212 are the vias connecting the various signal line layers. 206 is a silicon nitride stop layer used for the copper damascene process.

In another possible embodiment, the open trenches 208 could also be filled with a liquid coolant, a porous material, or be used as waveguides to allow an optical signal to pass through. The liquid coolant would be advantageous because it would help dissipate the heat of the nearby signal lines of powered elements. A porous material could be advantageous because, while it may not lower the dielectric constant as much as an open trench, it will provide more structural support. Finally, allowing an optical signal to pass through the trench would be advantageous because it would allow for a superior usage of space, resulting in an ultimately smaller, more efficient chip.

FIG. 3 depicts a non-conformal process for fabricating one embodiment of the present invention. Step (a) shows the initial device layer 302, containing transistors 316, 318, and others not shown, separated by insulators 314. 320 are the electronic connections for the transistors 316, 318, and others not shown. 321 is the electronic connection for the gate of the transistor, which may consist of one or more metals (two are shown) on top of a thin layer of dielectric material. First, a first layer of silicon oxide 304 is grown as shown in step (b). Next, a layer of photoresist 322 is added, shown in step (c). Photolithography may be used to pattern the photoresist, then the exposed/unexposed parts are removed, the trenches are dry etched, and the photoresist is removed using the standard techniques. Next, a layer of non-conformal oxide 304 is grown, which will not fill in but instead cover over the previously etched trenches, forming the gaps 308 shown in step (d). The non-conformal oxide 304 lies across the top of the gaps 308 and does not seep in to fill them. Another layer of photoresist 322 is applied, patterned, and dry etched as shown in step (e) to form the voids 309 in preparation for vias connecting all metal layers 312 to the electronic connections 320. A layer of conducting metal 310, such as tungsten, is then applied as shown in step (f). Tungsten may be used to form electronic connections between the device and the first of metal layers 312, however, the metal used for vias between metal layers 312 could be the same as those used to form the signal wires within the metal layers 312. Next, a silicon nitride stop layer 306 is deposited for the copper damascene process, shown in step (g). A second layer of silicon oxide 304 is then deposited, and another layer of photoresist 322 is added and patterned in preparation for a second metal layer 312. The patterned photoresist is then removed, and a layer of conducting material such as copper is added to form the wires in the second metal layer 312, as shown in step (h).

The process is then repeated to form additional metal layers. Step (i) shows another silicon nitride stop layer 306 on top of the second metal layer 312, then additional layer of silicon oxide 304 deposited on top of that. (there is no step (j)?) Step (k) shows another layer of photoresist 322, the trenches are dry etched, the photoresist is removed and another layer of non-conformal silicon oxide layer 304 is grown. Another layer of photoresist 322 is then applied, patterned for vias, and dry etched as shown in step (l). Another layer of photoresist should be then applied and patterned for the metal lines, then removed, as show in step (m). Some of the photoresist may remain in the voids opened for the vias as seen in step (m). All of the photoresist should be removed, then a low-level etch should etch through the silicon nitride stop layer and open up the connection for the metal layers 312, which should then be added as shown in step (n). This process can be repeated for all of the other necessary metal layers, the next layer added is shown by way of example in step (o).

Figure 4:
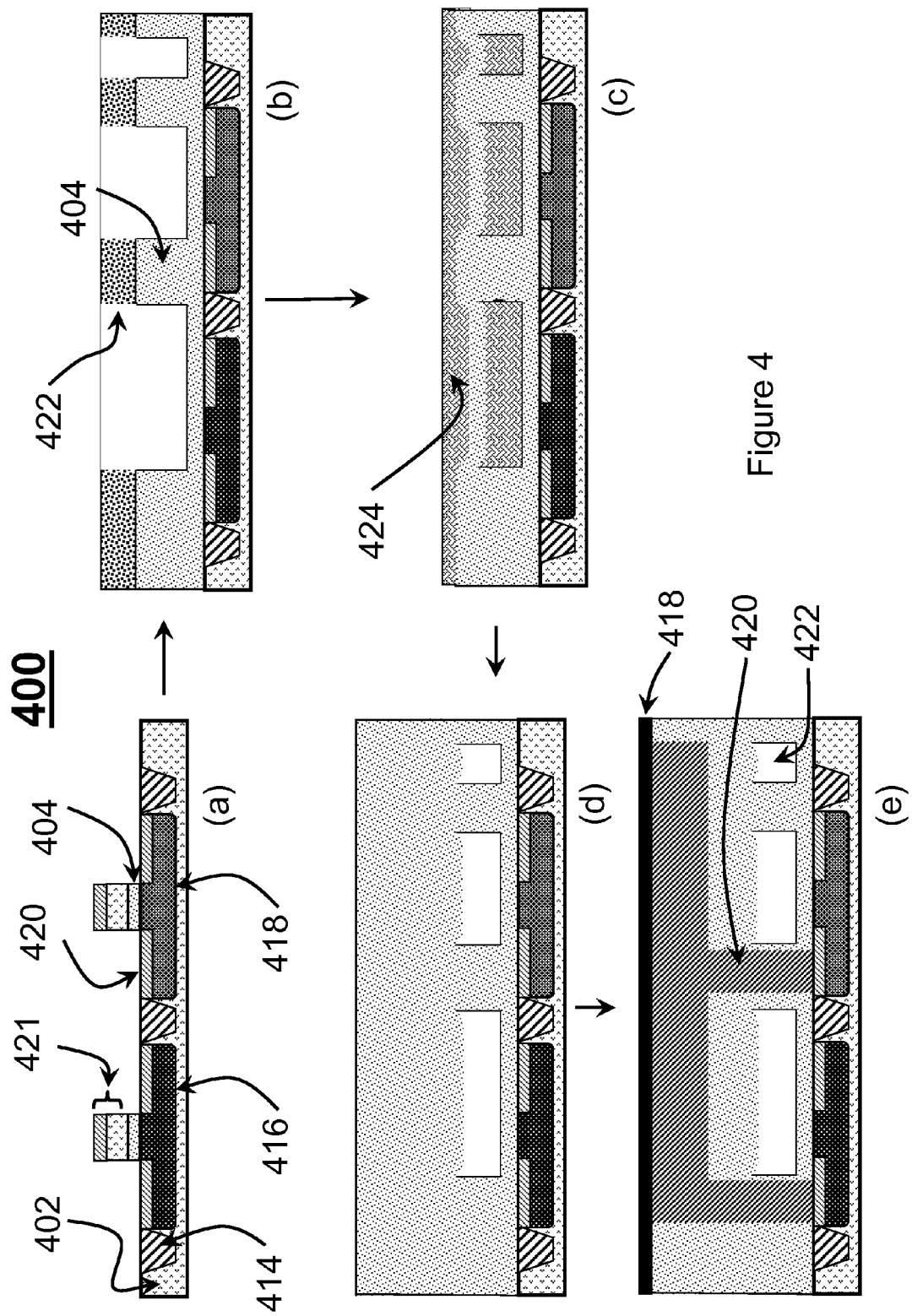
FIG. 4 is a structural depiction illustrating the sacrificial fabrication process of one embodiment of the present invention.

FIG. 4 depicts the sacrificial process for fabricating one embodiment of the present invention. The main difference in this process is that instead of covering the trenches with a non-conformal silicon oxide layer, the trenches are filled with a sacrificial material which is later burned out to leave empty air trenches behind. Step (a) shows the initial device layer 402, containing transistors 416, 418, and others not shown, separated by insulators 414. 420 are the electronic connections for the transistors 416, 418, and others not shown. 421 is the electronic connection for the gate of the transistor, which may consist of one or more metals (two are shown) on top of a thin layer of dielectric material. First, a layer of silicon oxide 404 is grown as shown in step (b), and a layer of photoresist 422 is added. Photolithography may be used to pattern the photoresist, then the exposed/unexposed parts are removed, the photoresist can be removed using standard techniques, and the trenches are dry etched. Next, a sacrificial material 424 is added, filling the trenches completely. The sacrificial material 424 should be dry etched to a level lower than the top of the trenches, and a thin layer of silicon oxide 404 should be deposited on top, sealing the sacrificial material into the trenches. The entire device should then be heated; burning away all of the sacrificial material, and thick layer of silicon oxide should be deposited, as shown in step (d). Step (e) then shows the completion of the layer using the normal processes to open contacts and add metal layers.

Figure 5A:
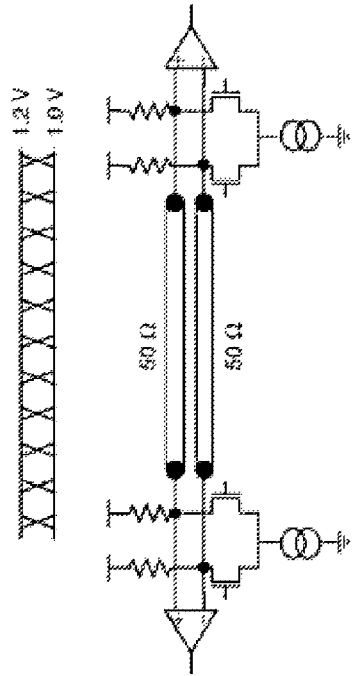
FIG. 5A is a schematic drawing of a differential interconnecting system between electronic elements.
Figure 5B:
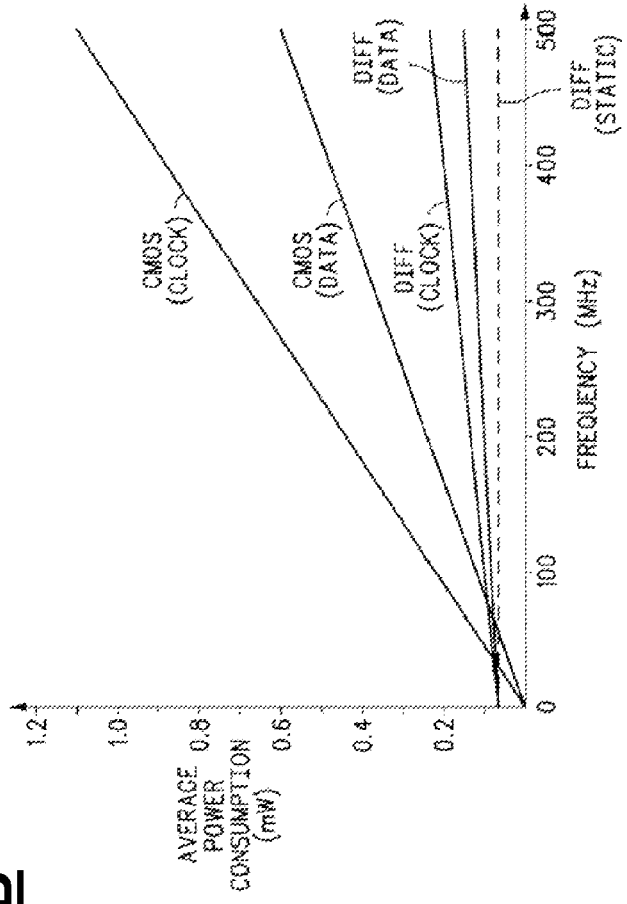
FIG. 5B is a graph showing the relative power consumptions of the CMOS standard and differential interconnect systems.

An additional embodiment of the present invention is to add the above described air gaps to on-chip interconnects which use differential signal lines. An example of a schematic for a differential signal line is shown in FIG. 5A. In contrast to a standard one directional signal line, differential signal lines use two close proximity parallel wires, and require a constant amount of static power to operate, even when no signal is being sent. The main advantage of differential signal lines is that the wires are coupled to each other, which minimizes or prevents signal slowing and power draining capacitance for other nearby wires. FIG. 5B is a graph showing the significantly reduced power consumption of differential lines compared to standard CMOS single directional signal lines. Because a differential signaling configuration reduces power drain, it is advantageous to utilize this configuration in conjunction with the present invention to maximize the reduction of power over the standard CMOS configurations.

Air-gap technology does lower the capacitance in between differential lines and therefore would also help increase the switching speed, by reducing RC delay.

With differential signal lines, each signal is generated through two differential lines, and if we use the same geometries for each layer, the area suffers a huge penalty, and would have to double in width if all of the interconnects are routed by differential signal lines instead. Also extra transistors would have to be included to generate the signals.

However, with the reduction in capacitance now we can also make the same interconnects spaced closer together to make up for some of the area penalty.

The area penalty of differential (lines) is also in part balanced out by the significant reduction in the power due to the scaling of the signal swing voltage. Dynamic power for a differential pair is calculated by:

$$P_{dyn} = 0.5\ C_w V_{dd} V_{sig} f \times 2\ \text{wires}$$

$$P_{dyn} = C_w V_{dd} V_{sig} f$$

We can scale the dynamic power of the differential pair by adding a signal scaling factor:

$$V_{sig} = V_{dd}(\text{Sig scaling factor})$$

$$P_{dyn} = C_w V_{dd} V_{dd}(\text{Sig scaling factor}) f$$

If the signal is scaled by a certain factor then the power can be reduced significantly.

Even with smaller spacing, with the wires very close together and the capacitance staying the same, the power can be reduced by half by scaling the VDD to 25% of the original VDD.

As space scaling decreases, capacitance goes up and the dynamic power consumption increases, but as signal swing scaling decreases the dynamic power consumption decreases. So as long as for a certain space scaling, if the VDD is scaled less than the space scaling factor, there will be a power advantage. The lowest dynamic power consumption comes from no space scaling and where the signal swing is scaled to 10% of its original value. However this means doubling the width that data lines would have to take up.

If we calculate the power index, which measures power per square centimeter, there is a significant reduction if we scale the voltage down to 25% of its original level. Even though power index compares the same area, it does not compare the same function or density of gates. Power index shows that there is a lower power density per area and therefore might actually help thermal properties, allowing heat to be dissipated more easily. Power index is calculated as follows (which is very similar to the ITRS version except for the signal scaling factor):

$$P_{index} = aC_w V_{dd} V_{dd} F_{signalscaling} e_w (1\ \text{GHz}) \frac{1\ \text{cm}^2}{\text{pitch}}$$

However for a 1 cm² sized chip, we can add up the power index to get a general measure of how much power is dissipated on a chip only by the interconnects, per GHz. A normal chip dissipates about 7.32 W per GHz, and so if running at 4 GHz, the interconnects dissipate about 29.28 W. If low-k materials are used, then the power can be around 5.44W per GHz and 21.74 W for a clock speed of 4 GHz.

However, if one uses a combination of air-gaps all around in SiO₂ and differential signal lines on most of the global interconnect levels, then one can reduce the power per GHz down to 2.7 W which is a 50% reduction.

With low-k materials and air-gaps and differential signal lines on various levels, one can further reduce the power consumption of the interconnects.

Static power is not accounted for and depends on the design of the differential signal circuits and also the process technology. Since it is mostly dynamic power savings, then probably the most active and switching next would be the most worth to be converted to differential signal nets.

Figure 5C:
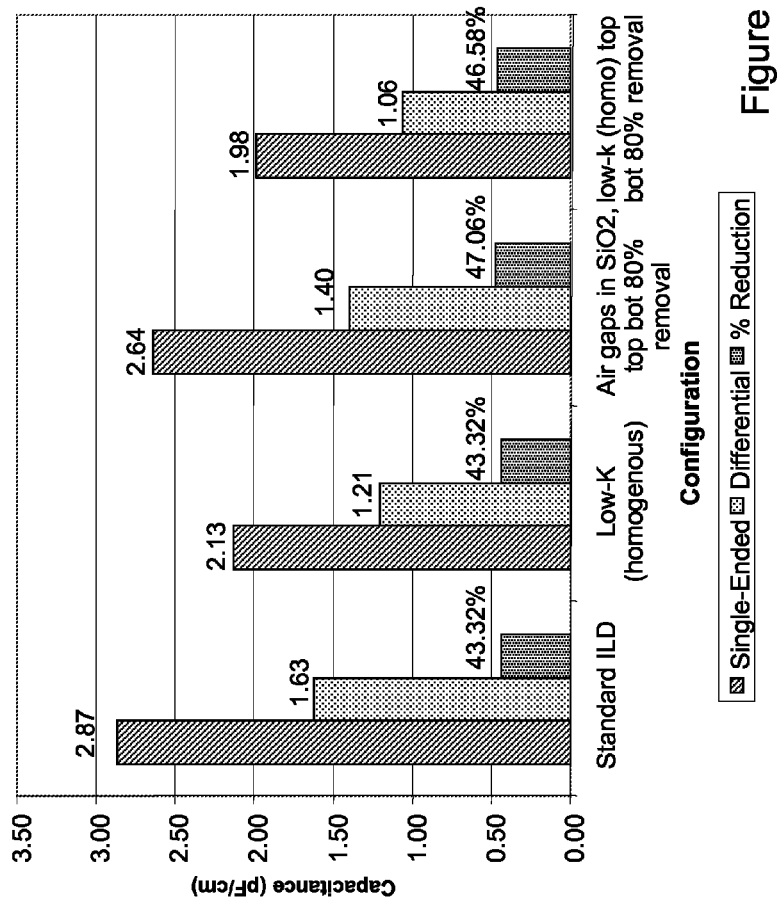
FIG. 5C is a graph showing the relative capacitance between the CMOS standard, Low K, and two different possible embodiments of the present invention. The present invention has significantly less capacitance.

FIG. 5C is a graph showing the relative advantage of the present invention. The highest percent reduction in capacitance is shown when the air gaps are used in conjunction with a differential signal line system. The standard CMOS signal line has a capacitance of 2.87 pf/cm, while one embodiment of the present invention using air gaps in $SiO_2$ in a differential signal line system had a capacitance of 1.4 pf/cm. This is a significant difference. The data shown here represents the worst case scenario and actual capacitance reduction may be greater than what is shown.

Figure 6:
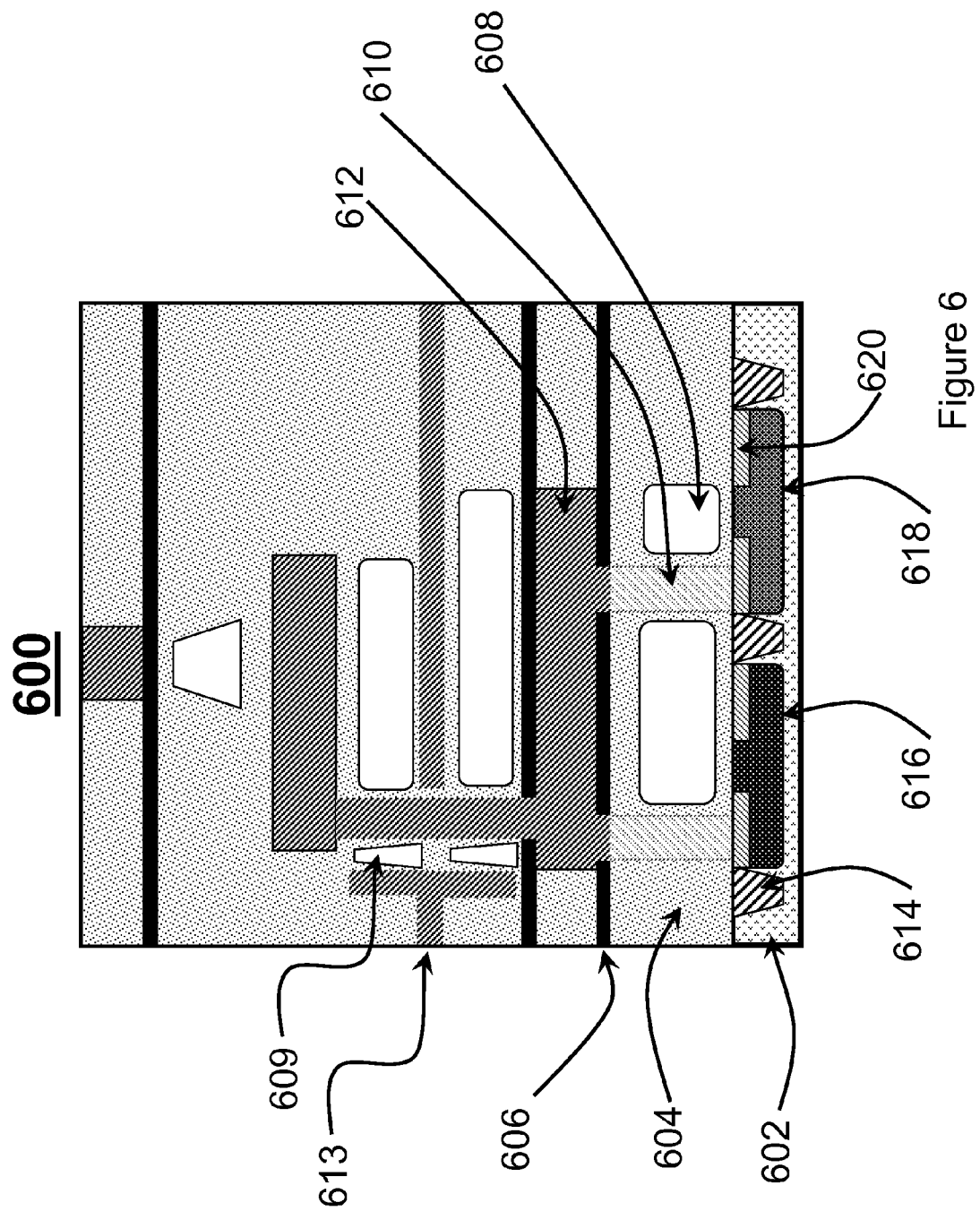
FIG. 6 is a structural depiction illustrating one embodiment of the present invention where a ground plane interposed in between metal layers.

FIG. 6 shows an additional embodiment of the present invention, using a ground plane 613 to further reduce capacitance between the metal signal electrodes. Because signal wires may cause capacitance to wires above and below them, it is advantageous to separate them with a ground plane 613, in addition to the use of air gaps, in order to minimize the capacitance between the metal signal wires, and therefore minimize power loss. The device layer 602, contains transistors 616, 618, and others not shown, separated by insulators 614. 620 are the electronic connections for the transistors 616, 618, and others not shown, 608 are the air gaps described above, and 610 are the metal vias in the first layer. 612 is the metal signal wires using metal material that can be used to form the signal planes and vias in the other metal layers. FIG. 6 also depicts open air trenches 609, which while still embedded in the dielectric layer, may be orientated to run parallel to a via instead of a metal signal wire in the signal plane. These vias-oriented trenches 609 function in the same way and under the same concept as adding trenches parallel to signal wires, but are simply oriented in the vertical rather than horizontal position, to enable the vias as well as the metal signal wires to have the lowest possible capacitance with the surrounding dielectric material, and therefore realize the lowest amount of loss of power.

It should be understood that alternative embodiments of the present invention include open trenches mentioned filled with a liquid coolant, a porous material, or used as waveguides to allow an optical signal to pass through. The liquid coolant would be advantageous because it would help dissipate the heat of the nearby signal lines of powered elements. A porous material could be advantageous because, while it may not lower the dielectric constant as much as an open trench, it will provide more structural support. Finally, allowing an optical signal to pass through the trench would be advantageous because it would allow for a superior usage of space, resulting in an ultimately smaller, more efficient chip.

It should also be understood that all or some of the dielectric materials mentioned could also be replaced with low-k materials in order to further reduce the dielectric constant.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is the object to provide interconnects technique by which the microwave loss can be reduced and then increase the bandwidth of the interconnects. It is also the object to use any dielectric material (including conventional dielectric materials and the manufacturing technology thereof) in the technique and increase the bandwidth tremendously. For simplicity of drawings, preferred embodiments are described mostly considering the microstrip line configuration. However, all transmission lines configurations such as strip line, coplanar line with single or multiple signal lines (including differential line) are also covered by this invention.

Several preferred embodiments for on-chips interconnects are described considering the microstrip line configuration with opened trenches or the dielectric periodic structure consisting of the cylindrical (spherical) air holes arrays or comb-shaped dielectric. All transmission lines configurations as mentioned earlier are covered under this invention. In the case of the trenches, all kinds of shapes are covered by this invention or fall within the scope of this invention such as square, circular, or rectangular or any shape convenient to the manufacturing. In the case of the air-holes periodic structure, the shape of each cell could be any type such as square, or any polynomial shape, and those can be filled up with dielectric materials having the lower dielectric constant than the dielectric substrate.

In the preferred embodiments, for simplicity of drawings, most of the surrounding structures of the high speed signal lines are considered as having open trenches, or air-holes periodic structure or comb-shaped dielectric structure. In on-chip interconnects, the configurations or mixes of such configurations can also be used in the multi-layered interconnects.

In the preferred embodiments, as the open-trenches or air holes or comb-shaped dielectric structure is used, the combination of optics and electronics interconnects are also feasible. Especially, the optical signal, with speed over 40 Gb/s or beyond, can pass through the trenches (air filled) or opening portion of the interconnects, and the electrical signal over 5 Gb/s to 40 Gb/s can pass through the metal signal line-configuration disclosed in this invention. Additional transmission media may not be necessary to build for optical and electrical signal purpose.

One advantage of this invention is that the trench of the proposed interconnects can also be used for cooling purposes. The trench can be filled with coolant or gas to dissipate the heat generated due to electrical signal flowing through the electrical signal lines or heat generated due to the other active and passive components' power consumption. Alternatively, the trench can be also filled with the porous materials.

According to this invention, the interconnects with opened-trench can be used to transmit optical signal through the air or vacuum. Low loss-tangent material can also be used to fill the trench, in this case, ultra high speed interconnects suitable for electrical and optical signal transmission can be achieved. Since the same trench can be used for both electrical and optical interconnects, high density can be achieved for high-speed transmission.

Although the invention has been described with respect to specific embodiments for complete and clear disclosure, the appended claims are not to be thus limited but are to be construed as embodying all modification and alternative constructions that may be occurred to one skilled in the art which fairly fall within the basic teaching here is set forth.

The present invention is expected to be found to be of use practically where the signal speed is 5 Gb/s or beyond (as high as 200 Gb/s) while using conventional materials, and the bandwidth of the interconnects can be made ideally corresponding to speed of the light for a no-loss transmission line. As the bandwidth of the interconnect system can be made ideally close to fiber, future monolithic (and also hybrid near future) integration of electronics and optical chips can also be interconnected without (much or none at all) sacrificing the chip speed.

What is claimed is:

1. A high speed electronics interconnection system for interconnecting two or more on-chip electronic elements, the interconnection system comprising:
   at least one electrical signal plane comprising at least one signal conductor for carrying an electrical signal along an xy-plane,
   wherein said xy-plane is a horizontal plane defined by Cartesian coordinates along the perpendicular X and Y axes, such that the height coordinate of said xy-plane is measured along the vertical axis Z;
   at least one first dielectric system such that one side of the at least one electrical signal plane is laid on the dielectric system, the dielectric system comprising:
   at least one dielectric layer, and
   at least one open trench embedded in the at least one dielectric layer.
      wherein each said at least one open trench is grouped with one of said at least one signal conductor,
      wherein each said at least one open trench runs parallel with and directly above and/or below the at least one signal conductor with which said at least one open trench is grouped, such that the xy-coordinates of said at least one open trench substantially match or overlap with the xy-coordinates of said at least one signal conductor, and
      wherein each said at least one open trench is located in close proximity to the at least one signal conductor with which said at least one open trench is grouped, such that dielectric loss across said at least one signal conductor is reduced;
   at least one signal via connected to the at least one signal conductor; and
   at least one second dielectric system, which is substantially similar to said at least one first dielectric system, stacked on the at least one first dielectric system without any additional electrical signal plane interposed in between the two dielectric systems, thereby forming a dual dielectric stacked system.

2. The interconnection system according to claim 1, further comprising a ground plane placed above and/or below said dual dielectric stacked system.

3. The interconnection system according to claim 1, wherein the dielectric material in the dielectric system is selected from a group consisting of dielectric materials and polymeric dielectric materials.

4. A method for fabricating the high speed electronics interconnection system of claim 1, wherein the interconnection system is fabricated using IC fabrication technology.

5. The interconnection system according to claim 1, wherein the at least one open trench is filled with a liquid coolant.

6. The interconnection system according, to claim 1, wherein the at least one open trench is tilled with a porous material.

7. The interconnection system according to claim 1 wherein the at least one open trench is designed to allow optical signals to pass through itself.

8. The interconnection system according to claim 1, comprising at least two said signal vias, wherein the at least one open trench is interposed in between and separating the two said signal vias.

9. The interconnection system according to claim 1, wherein the at least one open trench can be rectangular, square, circular or any shape convenient for manufacturing.

10. The interconnection system according to claim 1, further comprising a layer of dielectric material having uniform thickness deposited on the inside walls of the at least one open trench, wherein the material of the layer of dielectric material is the same as or different from the dielectric layer.

11. A method for lubricating the high speed electronics interconnection system of claim 1, comprising:
   growing a first layer of oxide on a first device or signal plane layer,
   spinning a layer of positive/negative photoresist on top of the first layer of oxide,
   using photolithography to pattern the layer of positive/negative photoresist,
   removing the exposed/unexposed parts of the positive/negative photoresist,
   dry etching to get at least one open trench,
   stripping the photoresist.
   growing a layer of non-conformal oxide to cover but not fill the at least one open trench,
   applying a chemical-mechanical planarization process to the to layer, and continuing to form the interconnection system using standard techniques such that the at least one open trench runs parallel to any or all portions of signal conductors.

12. A method for fabricating the high speed electronics interconnection system of claim 1, comprising:
   growing a first layer of oxide on a first device or signal plane layer,
   spinning a layer of positive/negative photoresist on top of the first layer of oxide,
   using, photolithography to pattern the layer of positive/negative photoresist,
   removing the exposed/unexposed parts of the layer of positive/negative photoresist,
   dry etching at least one open trench,
   stripping the layer of positive/negative photoresist,
   spinning a layer of sacrificial material into the at least one open trench,
   dry etching the layer of sacrificial material to a level below the top of the at least one open trench,
   depositing a thin layer of oxide on top of the layer of sacrificial material to cover the at least one open trench,
   heating all of the layers to burn away the layer of sacrificial material,
   depositing a second layer of oxide,
   applying a chemical -mechanical planarization process to the top layer, and
   continuing to form the interconnection system using standard techniques such that the at least one open trench runs parallel to any or all portions of signal conductors.

13. The interconnection system of claim 1,
   wherein the said at least one signal conductor is diffential signal lines comprising two signal lines orientated to be parallel with each other and configured to transmit a differential signal.

14. A high speed electronics interconnection system for interconnecting, two or more on-chip electronic elements, said. interconnection system comprising:
   at least one electrical signal plane comprising at least one signal conductor for carrying an electrical signal horizontally along the xy-plane,
   wherein said xy-plane is a horizontal plane defined by Cartesian coordinates along the perpendicular X and Y axes, such that the height coordinate of said xy-plane is measured along the vertical axis Z;
   at least one first dielectric system, wherein one side of the at least one electrical signal plane is laid on the at least one dielectric system or embedded in the at least one dielectric system, the at least one first dielectric system comprising:

at least one dielectric layer, at least one first open trench embedded in the at least one dielectric layer, and at least one second open trench embedded in the at least one dielectric layer, wherein each said at least one first open trench is grouped with one of said at least one signal conductor, wherein each said at least one first open trench runs parallel with and directly above and/or below the at least one signal conductor with which said at least one first open trench is grouped, such that the xy-coordinates of said at least one first open trench substantially match or overlap with the xy-coordinates of said at least one signal conductor, and wherein each said at least one first open trench is located in close proximity to the at least one signal conductor with which said at least one first open trench is grouped, such that dielectric loss across said at least one signal conductor is reduced;

at least one signal via connected to the at least one signal conductor, wherein said at least one second open trench is grouped with one of said at least one signal via, wherein each said at least one second open trench runs parallel with and adjacent to the at least one signal via with which said at least one second open trench is grouped, and wherein each said at least one second open trench is located in close proximity to the at least one signal via with which said at least one second open trench is grouped, such that dielectric loss across said at least one signal via is reduced; and at least one second dielectric system, which is substantially similar to said at least one first dielectric system, stacked on the at least one first dielectric system without any additional electrical signal plane interposed in between the two dielectric systems, thereby forming a dual dielectric stacked system.

15. The interconnection system of claim 14, wherein said at least one first open trench and/or said at least one second open trench is partially filled with dielectric, completely tilled with liquid coolant, or completely filled with porous material.

* * * * *